United States Patent [19]

Watabe

[11] Patent Number: 5,500,256
[45] Date of Patent: Mar. 19, 1996

[54] DRY PROCESS APPARATUS USING PLURAL KINDS OF GAS

[75] Inventor: Masahiro Watabe, Kawasaki, Japan

[73] Assignee: Fujitsu Limited, Kawasaki, Japan

[21] Appl. No.: 449,268

[22] Filed: May 24, 1995

[30] Foreign Application Priority Data

Aug. 16, 1994 [JP] Japan .................................. 6-192601

[51] Int. Cl.$^6$ ................................................. C23C 16/00
[52] U.S. Cl. ..................... 427/579; 427/585; 427/255.2; 427/255.3; 427/255.7; 437/238; 437/241; 118/715; 118/723 E; 118/725
[58] Field of Search ............................... 118/715, 723 E, 118/725; 427/255.2, 255.3, 255.7, 579, 585; 437/238, 241

[56] References Cited

FOREIGN PATENT DOCUMENTS

| | | |
|---|---|---|
| 57-37821 | 3/1982 | Japan . |
| 63-59319 | 4/1988 | Japan . |
| 2-234419 | 9/1990 | Japan . |
| 4-120277 | 4/1992 | Japan . |

OTHER PUBLICATIONS

Extended Abstracts (54th Autumn Meeting, 1993) The Japan Society of Applied Physics.

*Primary Examiner*—Richard Bueker
*Attorney, Agent, or Firm*—Armstrong, Westerman, Hattori, McLeland & Naughton

[57] ABSTRACT

An apparatus for manufacturing a semiconductor device including: a process chamber capable of being evacuated; a wafer susceptor disposed in the process chamber, the wafer susceptor having a plane on which a wafer to be processed is placed; a plurality of gas flow paths forming a structure of a plurality of spirals, facing the table, and being disposed along a flat plane generally parallel to the plane of the susceptor; and a plurality of gas ejecting holes formed in a plane of the gas flow paths facing the susceptor, for and along each gas flow path. A plurality of processes can be performed in the same chamber.

20 Claims, 5 Drawing Sheets

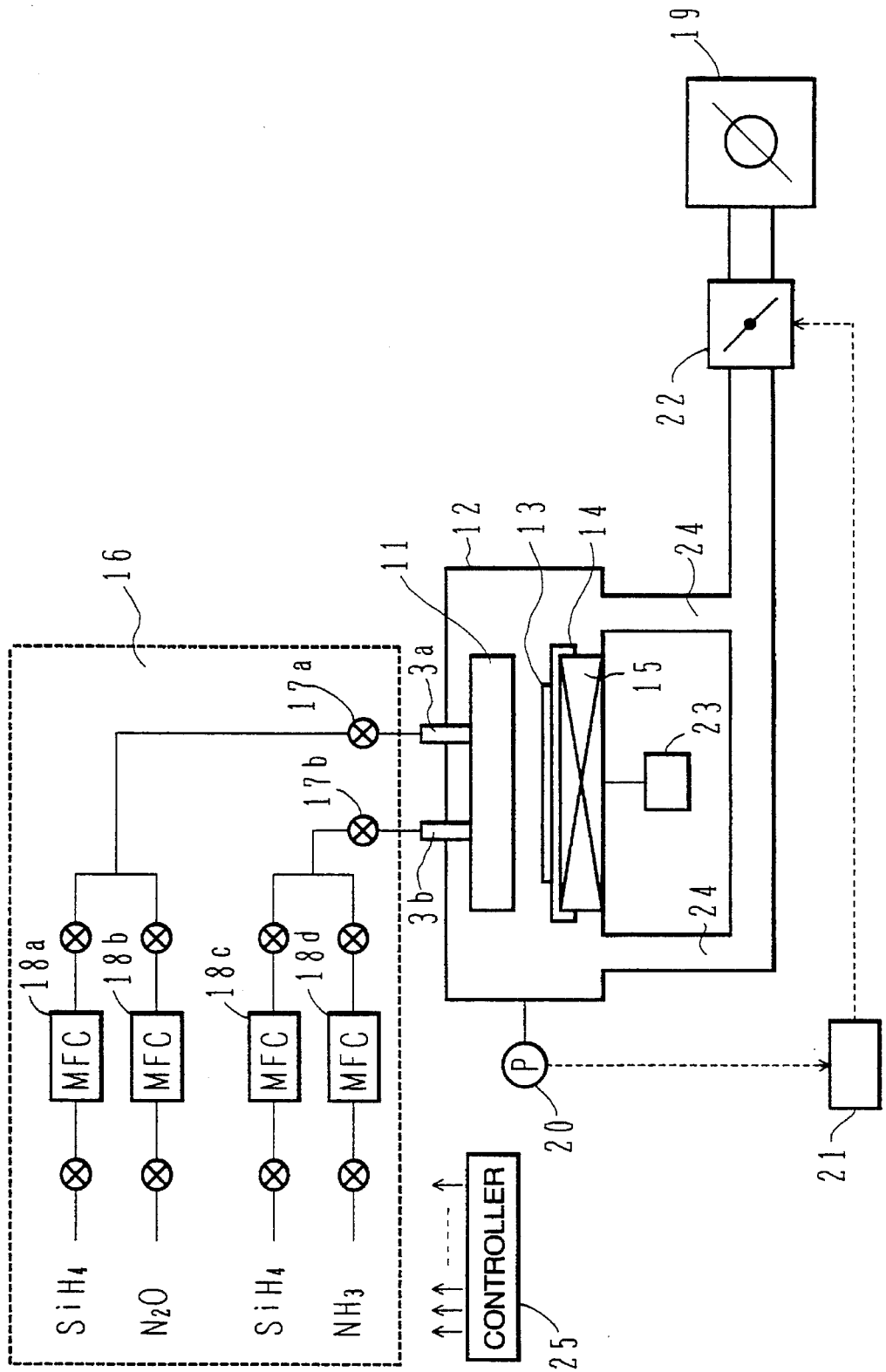

DRY PROCESS APPARATUS USING PLURAL KINDS OF GAS

BACKGROUND OF THE INVENTION a) Field of the Invention

The present invention relates to a vapor phase process technology, and more particularly to a technology of a vapor phase process for processing semiconductor wafer surface by supplying a process gas to the surface.

b) Description of the Related Art

As semiconductor devices are becoming fine, the number of manufacturing processes has increased and the processes have become complicated. An increase of manufacturing steps is one off the main reasons which lowers a yield off semiconductor devices. An increase of manufacturing steps also increases the number of manufacturing apparatuses and raises a manufacturing cost. It has been desired therefore to lower the cost by sharing manufacturing processes and apparatuses.

Multi chambers of an apparatus have progressed much so as to satisfy the demands for sharing manufacturing processes and apparatuses, and the number of process steps to be performed by the same apparatus has increased. However, a time required for replacing a gas in a reaction process chamber of a chemical vapor deposition system or the Like with an inert atmosphere has not been shortened satisfactorily. Even in the same system, a wafer is transported from one chamber to another so that the problem of particle attachment occurs.

A natural oxide film formed on a processed wafer surface before the wafer is passed to the next process has recently given rise to new trouble. It is an urgent issue to solve these problems because semiconductor devices are expected to become finer and finer, and the natural oxide will be no more of negligible thickness.

SUMMARY OF THE INVENTION

It is an object of the present invention to provide a method of manufacturing a semiconductor device capable of performing a plurality of processes in the same chamber.

According to one aspect of the present invention, there is provided a vapor phase processing system including: a process chamber capable of being evacuated; a wafer susceptor disposed in the process chamber, the wafer susceptor having a plane on which a wafer to be processed is placed; a plurality of gas flow paths forming a structure off a plurality of spirals, facing the wafer susceptor, and being disposed along a flat plane generally parallel to the wafer susceptor; and a plurality of gas supply holes formed in a plane of the gas flow paths facing the wafer susceptor, for and along each gas flow path.

All of the plurality of gas flow paths may be formed to have the same conductance of gas-flow under equivalent conditions. The size of each of the gas supply holes or the pitch of the gas supply holes may be different for one gas flow path to another.

The plurality of gas flow paths may be made of conductive material, and the vapor phase processing apparatus may include one or more high frequency power sources for supplying a high frequency power to one or more of the plurality of gas flow paths. The plurality of gas flow paths may be electrically isolated from each other, and the high frequency power source may be provided for each of the plurality of gas flow paths.

One of the one or more high frequency power sources may be adapted to supply superposed high frequency power at two or more frequencies at a desired frequency component power ratio.

The plane of the plurality of gas flow paths facing the susceptor is preferably a flat plane parallel to the plane of the susceptor.

According to another aspect of the present invention, there is provided a method for a vapor phase process including: a step of placing a wafer to be processed, in a process chamber capable of being evacuated; a first vapor phase process step of processing the wafer by supplying a first process gas from a first gas flow path group including one or more gas flow paths, the first gas flow path group being selected from a plurality of gas flow paths disposed along a flat plane generally parallel to the wafer and forming a structure of a plurality of spirals, each gas flow path independently supplying a process gas; and a second vapor phase process seep of processing the wafer by supplying a second process gas from a second gas flow path group including one or more gas flow paths different from the first gas flow path group selected from the plurality of gas flow paths.

One of the first and second vapor phase process steps may process the wafer while supplying a high frequency power to the plurality of gas flow paths and generating high frequency plasma in the process chamber. The first and second vapor phase process steps may process the wafer by supplying a high frequency power to the plurality of gas flow paths and generating high frequency plasma in the process chamber. One of the first and second vapor phase process steps may supply a high frequency power at two or more frequencies superposed one upon another to one of the first and second gas flow path groups.

The first and second vapor phase process steps may supply a high frequency power only to the first and second gas flow path groups. For example, the one of the first and second vapor phase process steps may be a seep of forming an SiN film by supplying a mixed gas of $SiH_4$ and $NH_3$, and the other of the first and second vapor phase process steps may be a process of forming an $SiO_2$ film by supplying a mixed gas of $SiH_4$ and $N_2O$.

A group of steps including the first and second vapor phase process steps may repeated by a certain number of times, or the first and second vapor phase process steps may be performed at the same time. For example, the first vapor phase process step may be a step of forming an $O_3$-TEOS oxide film by supplying a mixed gas of $O_3$ and tetraethoxysilane, and the second vapor phase process step may be a step of cleaning an exposed surface of the wafer by supplying a gas containing fluorine.

Gas flow paths may be formed to have different conductance of gas flow, the first and second vapor phase process steps are performed under such a condition that gas pressures at the most upstream positions of the plurality of gas flow paths are generally equal to each other, and the first and second gas flow path groups include gas flow paths selected so as to set a flow rate ratio of the first process gas to the second process gas to a certain value.

By providing a plurality of gas flow paths for introducing process gases, it becomes possible to separately transport a plurality of process gases to a process chamber. Accordingly, reaction between process gases in the gas flow paths can be avoided and particles are not generated. By time sequentially switching between the operations of supplying process gases via a plurality of gas flow paths, it becomes possible to perform a plurality of processes in the same process chamber. Accordingly, manufacturing apparatuses can be unified and particles to be caused by the transport of wafers are avoided, so that a reduced manufacturing cost and an improved yield can be expected.

The gas flow paths of a structure of plural spirals are used for supplying a process gas from gas supply holes formed along each gas flow path. Accordingly, a process gas can be supplied generally uniformly to a wafer to be processed.

If all the gas flow paths are formed to have the same conductance, the supply conditions of a plurality of process gases can be easily matched each other. If the size or pitch of gas supply holes is changed at each gas flow path to make each gas flow path have a different conductance, process gases of a desired flow rate ratio can be supplied in accordance with different conductantes while maintaining a supply pressure of process gases constant.

If the gas flow paths are made of conductive material, the gas flow paths can be used as a plasma generation electrode. If the gas flow paths are electrically isolated from each other, a high frequency power for plasma generation can be supplied to each gas flow path independently. It becomes therefore possible to independently use a plurality of high frequency oscillators, and to switch between high frequency powers in a short time.

If a superposed high frequency power at two frequencies is supplied, stress of a thin film formed by a vapor phase process can be controlled.

If the plane of the gas flow paths facing a wafer to be processed is made to constitute a flat plane parallel to the wafer, this structure becomes like a parallel plate electrode. Accordingly, disturbance of a high frequency electric field is made small, and stable plasma can be generated.

As described above, it is possible to perform a plurality of processes alternately in the same process chamber by switching between the processes in a shore time, or to perform a plurality of processes at the same time. Accordingly, manufacturing apparatuses and processes can be unified, and a reduced manufacturing cost and an improved yield are possible.

BRIEF DESCRIPTION OF THE DRAWINGS

FIG. 2 is a schematic cross sectional view of a vapor phase process system using the process gas ejecting device shown in FIGS. 1A to 1C, accompanied by a gas supply system diagram.

DETAILED DESCRIPTION OF THE PREFERRED EMBODIMENTS

Figure 1A:
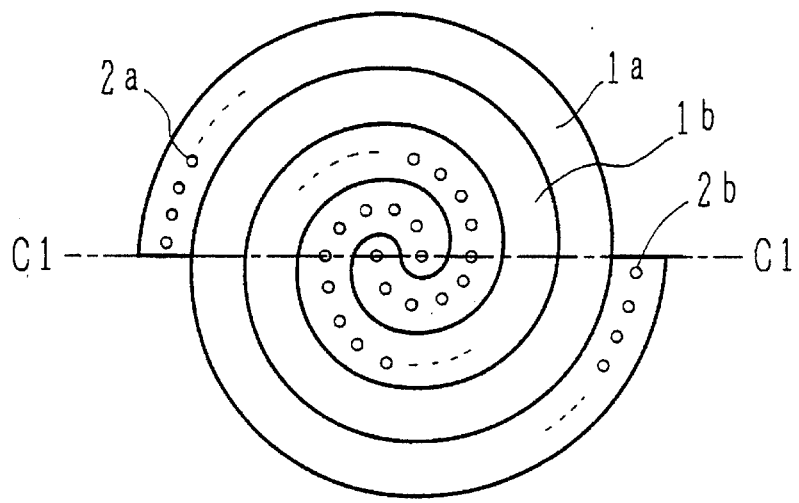
FIGS. 1A, 1B, and 1C are a bottom view, a side view, and a cross sectional view, respectively, showing a fundamental structure of a process gas ejecting device according to an embodiment of the invention.
Figure 1B:
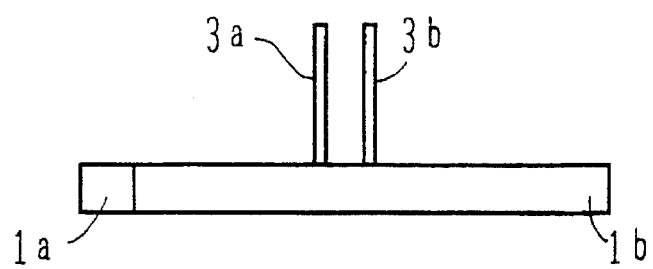
Figure 1C:
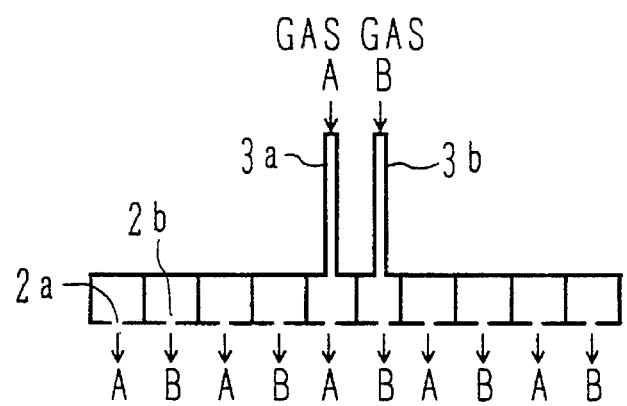

Referring to FIGS. 1A to 1C, the fundamental structure of a process gas ejecting device of a vapor phase processing system according to an embodiment of the invention will be described. FIG. 1A is a bottom view of the process gas ejecting device, FIG. 1B is a side view thereof, and FIG. 1C is a cross sectional view thereof taken along one-dot chain line C1—C1 of FIG. 1A.

As shown in FIG. 1A, two independent spiral gas flow paths 1a and 1b are formed on the same flat plane. The gas flow paths 1a and 1b are each disposed so as to jointly occupy a circular area. A plurality of gas supply or jetting holes 2a and 2b are formed in the bottom planes of the gas flow paths 1a and 1b from the inner circular start areas to the outer circular end areas.

As shown in FIG. 1B, gas supply pipes 3a and 3b are connected to the inner circular start areas of the gas flow paths 1a and 1b. As process gases are supplied from the gas supply pipes 3a and 3b to the gas flow paths 1a and 1b, the process gases flow along the gas flow paths 1a and 1b and part of the gases is ejected out of the gas jetting holes 2a and 2b.

As shown in FIG. 1C, process gases A and B supplied from the gas supply pipes 3a and 3b are ejected out of the gas jetting holes 2a and 2b. Since the jetting holes 2a and 2b are disposed uniformly over generally the whole gas jetting plane, the gases A and B can be ejected out into a process chamber independently and generally uniformly. The jetting holes 2a and 2b are designed to supply equal amounts of gas under a designed pressure difference.

The gas flow paths 1a and 1b have the same shape and the same conductance of gas flow. As a result, the process gases A and B can be ejected out under the same gas supply condition.

The gas flow paths 1a and 1b are configured so as to divide a single continuous flat plane into two partial planes. An electrode function similar to a parallel plate electrode can be obtained if the bottoms of the gas flow paths are made of a conductive plate.

Next, with reference to FIG. 2, a chemical vapor deposition (CVD) system using the process gas ejecting device shown in FIGS. 1A to 1C will be described.

FIG. 2 is a schematic cross sectional view of the CVD system according to an embodiment of the invention, accompanied by a gas supply system diagram. A process gas ejecting device 11 such as shown in FIGS. 1A to 1C is mounted in a process chamber 12 at the upper region thereof. Gas supply pipes 3a and 3b connected to the process gas ejecting device 11 are extended out of the process chamber 12.

A susceptor 14 for mounting thereon a wafer 13 to be processed is disposed at the position counter to the process gas ejecting device 11. A heater is is mounted on the bottom of the susceptor 14 and can heat the susceptor 14 and wafer 13.

The susceptor 14 and heater 15 can be rotated by a motor 23 about its shaft, the motor being mounted under the heater 15. With this arrangement, the vapor process condition for the wafer substrate can be made uniform at each azimuthal position. The process chamber 12 is connected to a vacuum system 19 via a gas exhaust pipe 24 and a variable conductance valve 22, and can evacuate the inside of the process chamber 12.

A pressure in the process chamber 12 can be measured with a vacuum or pressure meter 20. A pressure measured with the vacuum meter 20 is inputted to a pressure controller 21. The controller 21 compares the pressure measured with the vacuum meter 20 with a preset target pressure, and controls the variable conductance valve 22 so as to set the inner pressure of the process chamber to the target pressure.

Gases of predetermined flow rates are supplied from a gas supply system 16 to the gas supply pipes 3a and 3b during a predetermined time period. The gas supply system 16 shown in FIG. 2 is intended to form a silicon oxide film ($SiO_2$ film) and a silicon nitride film (SiN film). $SiH_4$ and $N_2O$ gases are flowed via mass flow controllers 18a and 18b to a valve 17a which is connected to the gas supply pipe 3a. As the valve 17a is opened, a mixed gas of $SiH_4$ and $N_2O$ of a predetermined flow rate is supplied to the inside of the process chamber 12.

$SiH_4$ and $NH_3$ gases are flowed via mass flow controllers 18c and 18d to a valve 17b which is connected to the gas supply pipe 3b. As the valve 17b is opened, a mixed gas of $SiH_4$ and $NH_3$ of a predetermined flow rate is supplied to the inside of the process chamber 12.

A controller 25 generates control signals for the valves and other control signals.

Figure 3:
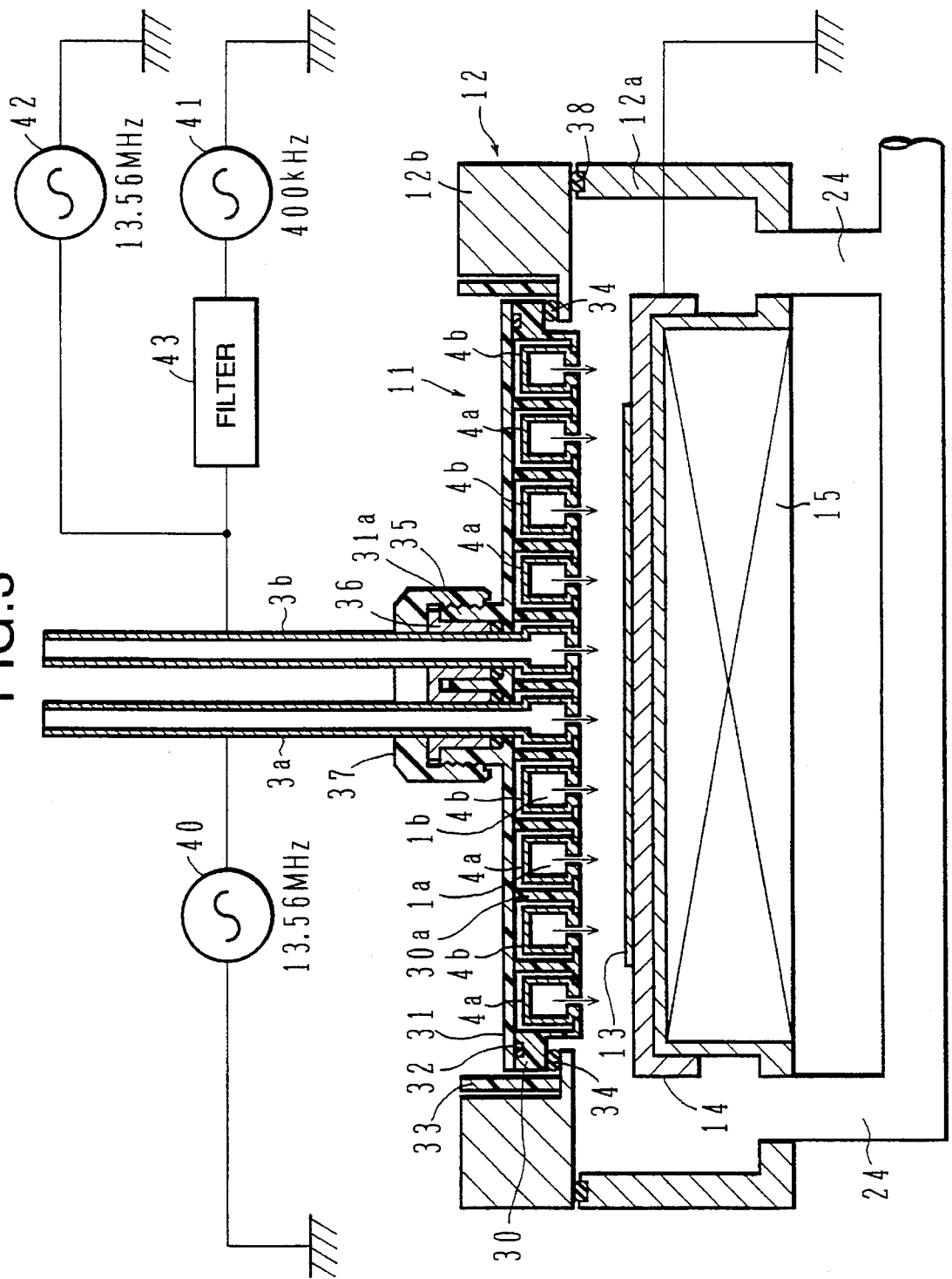
FIG. 3 is a cross sectional view of a process chamber and the process gas ejecting device used by the vapor phase process system shown in FIG. 2.

FIG. 3 is a cross sectional view showing the details of the processor chamber 12 and process gas jetting device 11. The process chamber 12 is mainly formed of metal such as stainless steel and constituted by a chamber main body 12a and a ring lid 12b. An O-ring is squeezed between the lid 12b and the chamber main body 12a to provide a hermetieal seal. A projection is formed on the lid 12b along its inner circumference, at the lower portion thereof. The upper surface of the projection supports the process gas ejecting device 11.

The process gas jetting device 11 is mainly constituted by spiral gas pipes 4a and 4b which define gas flow paths 1a and 1b, a lower support member 30 for supporting the spiral gas pipes, and an upper lid 81 for providing a hermetical seal of the process chamber 12. The lower support member 80 and upper lid 81 are made of insulating material such as ceramics. The spiral gas pipes 4a and 4b are made of conductive material such as stainless steel.

An insulator partition wall 30a is formed on the lower support member 30 in order no fix the spiral gas pipes 4a and 4b to predetermined positions and electrically isolate the pipes 4a and 4b. The outer circumferential portion of the lower support member 30 engages with the projection of the lid 12b at the inner circumference thereof so that the lower support member 30 is held in a predetermined position. An O-ring 34 is squeezed at this engaging area to provide a hermetical seal.

The spiral gas pipes 4a and 4b are fitted in spiral paths defined by the isolator partition wall 30a of the lower support member 30. A projection formed on the insulating partition wall 30a at the lower side wall thereof supports the spiral gas pipes 4a and 4b.

The bottoms of the spiral gas pipes 4a and 4b are worked to be flat. Therefore, the bottoms of the spiral gas pipes 4a and 4b inserted in the lower support member 30 are flush with the same flat plane. The gas supply pipes 3a and 3b are connected to the inner circular start areas of the spiral gas pipes 4a and 4b.

A position aligning side wall ring 33 is inserted in the space between the outer circumference of the lower support member 30 and the inner circumference of the lid 12b.

The insulating upper lid 31 of a disc shape is mounted on the lower support member 30 and has through holes through which the gas supply pipes are passed. An O-ring 32 is squeezed between the lower support member 30 and the upper lid 31 at the outermost circumference area thereof to provide a hermetic seal.

The through holes are formed in a central thick portion 31a of the upper lid 31. O-rings 35 are inserted into the spaces between the inner circumferential plane of the through holes and the gas supply pipes 3a and 3b to hermetically seal the spaces therebetween. The O-rings 35 are pushed down by a collar 86 inserted into the spaces. Threads are formed in the outer circumference wall of the thick portion 31a. The collar 36 is pushed down by a collar pusher 37 which engages with the threads. The collar and collar pusher are made of insulating material.

The susceptor 14 for placing the wafer 13 thereon is disposed near the bottom of the chamber main body 12a. The susceptor 14 can be heated with the heater 15 mounted on the bottom of the susceptor 14. The susceptor 14 is connected to a ground potential. A rotary mechanism for the susceptor is omitted in FIG. 3.

The gas supply pipe 3a is connected to a high frequency (RF) power source 40 and applied with a high frequency power of 13.56 MHz. This high frequency power is transmitted to the spiral gas pipe 4a. The gas supply pipe 3b is connected to a high frequency power source 42 and applied with a high frequency power of 13.56 MHz, and also connected to a high frequency power source 43 and applied with a high frequency power of 400 kHz. A superposed high frequency power of 13.56 MHz and 400 kHz is transmitted to the spiral gas pipe 4b.

When the gas supply pipe 3a or 3b is applied with a high frequency power, a high frequency electric field is generated in the space between the susceptor 14 and the spiral gas pipe 4a or 4b. This high frequency electric field generates plasma. The bottoms of the spiral gas pipes 4a and 4b are worked to be flat so that disturbance of an electric field can be minimized.

Since the gas pipes are mutually isolated, different high frequency power sources can be used independently.

If one high frequency power source only is used, the gas pipes 4a and 4b may be electrically connected together for the connection to the one power source. Even if a plurality of high frequency power sources are used, a desired high frequency power source may arbitrarily be connected to the gas pipe 4a or 4b or both by using switch circuits or the like.

Next, a method of performing a vapor phase process by using the vapor phase processing system shown in FIGS. 2 and 3 will be described, giving a formation of a laminate structure of $SiO_2$ and SiN films as an example. The laminate structure of $SiO_2$ and SiN films alternately stacked is used, for example, in a fin type capacitor of a DRAM.

A wafer 13 to be processed is placed on the susceptor 14, the valves 17a and 17b are closed, and the inside of the process chamber 12 is evacuated. At the same time, the wafer 13 is heated with the heater 15 to a predetermined temperature.

When the predetermined temperature and vacuum degree are reached, the valve 17a is opened to introduce a mixed gas of $SiH_4$ and $N_2O$ of a predetermined flow rate and form an $SiO_2$ film on the wafer 13. In this case, the pressure controller 21 controls the variable conductance valve 21 so as to set the inner pressure of the process chamber 12 to a predetermined pressure.

After the $SiO_2$ film is formed to a predetermined thickness, the valve 17a is closed. The inside of the process chamber 12 is again evacuated to a predetermined vacuum degree.

Next, the valve 17b is opened to introduce a mixed gas of $SiH_4$ and $NH_3$ and form an SiN film on the wafer 13. Also in this case, similar to the formation of the $SiO_2$ film, the inside of the process chamber 12 is maintained to take a predetermined temperature. After the SiN film is formed to a predetermined thickness, the valve 17b is closed. Thereafter, the inside of the process chamber 12 is again evacuated.

By alternately repeating the process of forming the SiO$_2$ film and the process of forming the SiN film, a laminate structure of SiO$_2$ and SiN films can be formed.

Gas can be supplied uniformly to a wafer during the film forming process by ejecting the gas out of the gas ejecting holes formed in the spiral gas pipe shown in FIG. 3 along the gas flow path. Source gases for the SiO$_2$ film and SiN film are supplied via separate and independent gas flow paths to the gas jetting holes. Therefore, these gases will not be mixed in the gas flow paths so that reaction between the source gases can be avoided and particles are not generated.

Source gases for both the films can be introduced into the process chamber 12 under the same condition because the two spiral gas pipes are formed separately.

In the above embodiment, the SiO$_2$ and SiN films are formed by general CVD. The films may be formed by plasma CVD by applying high frequency powers from the high frequency power sources 40, 41, and 42 shown in FIG. 3 and generating plasma in the process chamber 12. Stress or the quality off a formed film can be controlled by using, as the power for generating plasma, both a relatively high frequency power at 13.56 MHz or at an integer multiple thereof and a relatively low high frequency power at 1 MHz or lower such as at 400 kHz.

When the source gases for the SiO$_2$ film are introduced from the gas supply pipe 3a, a high frequency power at 13.56 MHz is supplied from the high frequency power source 40. When the source gases for the SiN film are introduced from the gas supply pipe 3b, high frequency powers at 400 kHz and at 13.56 MHz are supplied from the high frequency power sources 41 and 42.

The SiO$_2$ film can be formed at a high speed by plasma enhanced (PE) CVD at a frequency of 13.56 MHz. It is known that stress of an SiN film can be controlled if it is formed by using two high frequency electric fields. For example, if the frequency components of 400 kHz are strong, a formed SiN film becomes compressive, whereas if the frequency components of 13.56 MHz are strong, the film becomes tensile. By controlling the powers of two frequency components, an SiN film with less stress can be deposited.

As described above, since the high frequency power sources can be controlled independently for source gases, a plasma process suitable for a film to be formed can be performed with ease. By using the high frequency power sources separately and independently, it becomes possible to switch between high frequency electric fields in a short time. This is particularly effective for repetitively forming a thin film.

As described above, a plurality of film forming processes can be performed in the same chamber without transporting a wafer between chambers. It is therefore expected that a process time can be shortened and particles are prevented from being generated.

In the embodiment described with FIGS. 1A to 1C, 2, and 3, all the conductances of spiral gas flow paths inclusive of gas ejecting holes are equal. Each conductance, however, may be made intentionally different. Next, an embodiment of a process gas jetting device having different conductances of gas flow paths will be described.

Figure 4A:
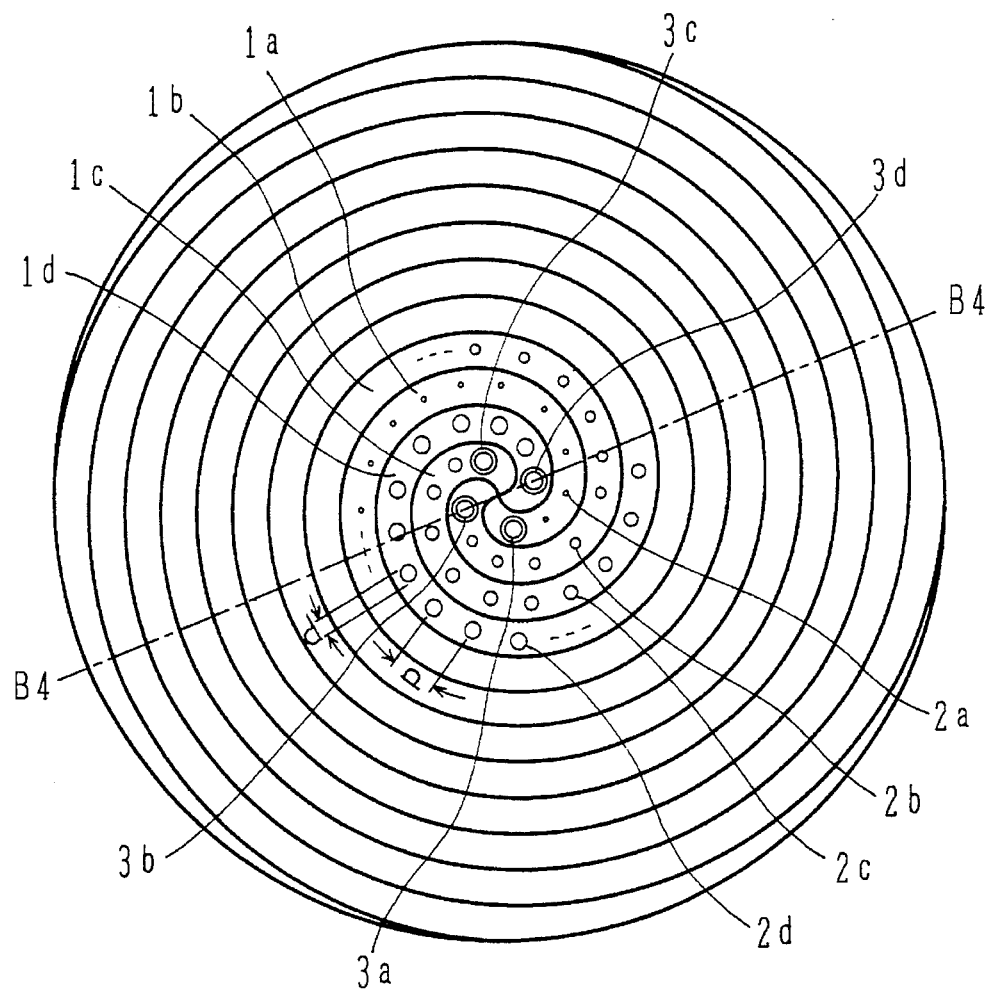
FIGS. 4A and 4B are a bottom view and a cross sectional view showing a structure of a process gas ejecting device according to another embodiment of the invention.
Figure 4B:
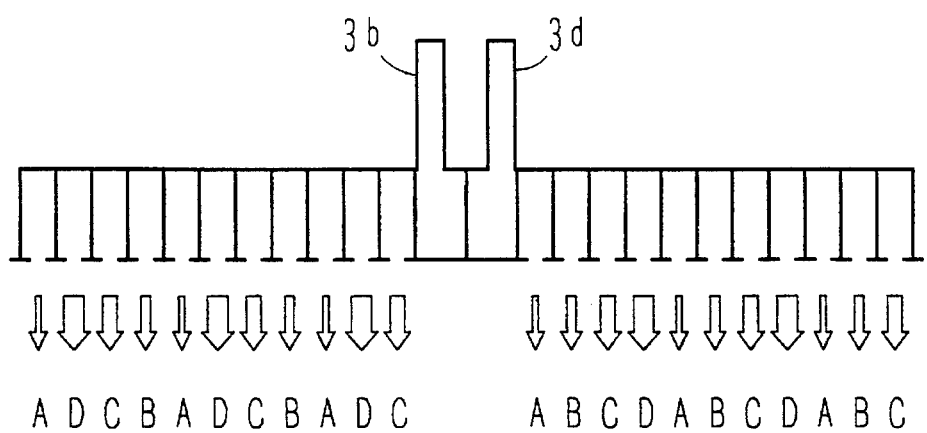

FIGS. 4A and 4B show a process gas ejecting device having a different structure from the embodiment shown in FIGS. 1A to 1C. FIG. 4A is a bottom view of the process gas jetting device, and FIG. 4B is a cross sectional view taken along one-dot chain line B4—B4 of FIG. 4A.

As shown in FIG. 4A, four independent spiral gas flow paths 1a to 1d are formed on the same flat plane. Gas supply pipes 3a to 3d are connected to the inner circular start areas of the gas flow paths 1a to 1d. A plurality of gas jetting holes 2a to 2d having predetermined sizes are formed along the spiral gas flow paths 1a to 1d at a predetermined interval.

Each gas flow path 1a to 1d has substantially the same shape. By changing the sized or interval or pitch p of the gas jetting holes 2a to 2d, the conductances of the spiral gas flow paths 1a to 1d can be changed. In the example shown in FIG. 4, the size of the gas jetting holes 2a is smallest, and the sizes of the gas jetting holes 2b, 2c, and 2d become larger in this order.

Assuming that a difference between a gas pressure at the most upstream position in each spiral gas flow path and an external gas pressure is constant, the flow rate of gases jetted out of the gas jetting holes is defined by a function of the conductance of the spiral gas flow path. Therefore, if the conductance of each spiral gas flow path is set to a predetermined value and if the pressure of gas supplied from each of the gas supply pipes 3a to 3d is set to be constant, gases of a desired gas flow rate can be introduced to the spiral gas flow paths 1a to 1d.

As shown in FIG. 4B, gases A to D introduced from the gas supply pipes 3a to 3d are jetted out of the gas jetting holes 2a to 2d. The flow rate of the jetted gas A is smallest, and the flow rates of the jetted gases B, C, and D become larger in this order.

As above, the gas flow rate can be controlled by changing the conductance of each spiral gas flow path. Therefore, the gas flow is not necessary to be controlled by other methods and the apparatus structure can be simplified.

If the conductance of each spiral gas flow path 1a to 1d of the process gas jetting device shown in FIGS. 4A and 4B is set so as to obtain a gas flow ratio of, for example, 1:2:3:4, then a gas flow ratio of any combination of these ratio values may be obtained. Further, although the number of spiral gas flow paths shown in FIGS. 4A and 4B is four, two, three, or five or more spiral gas flow paths may be used. As the number of spiral gas flow paths is increased, it becomes possible to select a desired gas flow ratio from a number of ratio value combinations, by selecting a desired combination.

The number of spiral gas flow paths is not limited to one path per each process. Instead, a single process gas may be jetted out at the same time from a desired combination of a plurality of spiral gas flow paths. By using a combination of a plurality of spiral gas flow paths, the degree of freedom of setting a rate of gas flow rates is increased. For example, in the case of using four spiral gas flow paths, if the spiral gas flow paths having flow rates of 1 and 4 are used at the same time and the paths having flow rates of 2 and 3 are used at the same time, then a process can be performed at a flow ratio of 1:1.

In the embodiment shown in FIGS. 2 and 3, a laminate structure of thin films is formed by alternately supplying source gases from the two spiral gas flow paths. Instead, a process gas may be supplied from the two spiral gas flow paths at the same time.

For example, an O$_3$-TEOS oxide film may be formed by flowing a gas containing ozone (O$_3$) and tetraethoxysilane (TEOS) along one spiral gas flow path and flowing a gas containing fluorine (F) along the other spiral gas flow path.

It is known that if a gas containing F is introduced while forming an $O_3$-TEOS oxide film, a cleaning function is achieved during the film forming reaction and the step coverage of the oxide film is improved (refer to a lecture No.28p-X2, 1993/P of the 54-th Autumn scientific lecture meeting of the Japan Society of Applied Physics, by Mizuno et al).

Mixing a gas containing F with the source gases for an $O_3$-TEOS oxide film is generally dangerous. Use of the process gas jetting device of the embodiment can improve safety because both the gases can be supplied separately until they reach and pass through the gas jetting holes. Furthermore, since both the gases can be supplied uniformly to a wafer, a film can be formed uniformly on the wafer and the wafer can be cleaned uniformly.

The source gases for an $O_3$-TEOS oxide film and the gas containing F may be alternately supplied by switching therebetween time sequentially. Also in this case, the similar cleaning effect is ensured and the step coverage of the $O_3$-TEOS oxide film is improved.

Figure 5A:
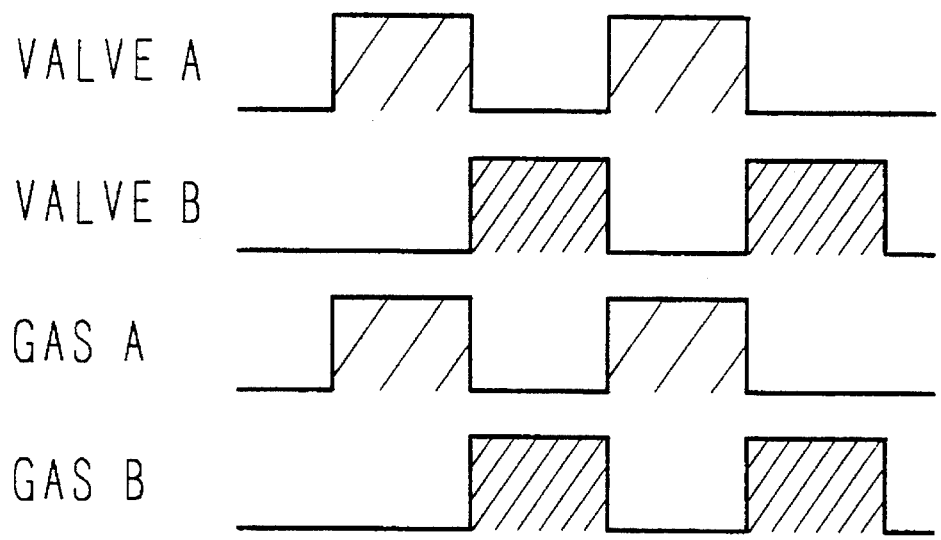
FIGS. 5A and 5B are timing charts explaining the operation of gas switching control.
Figure 5B:
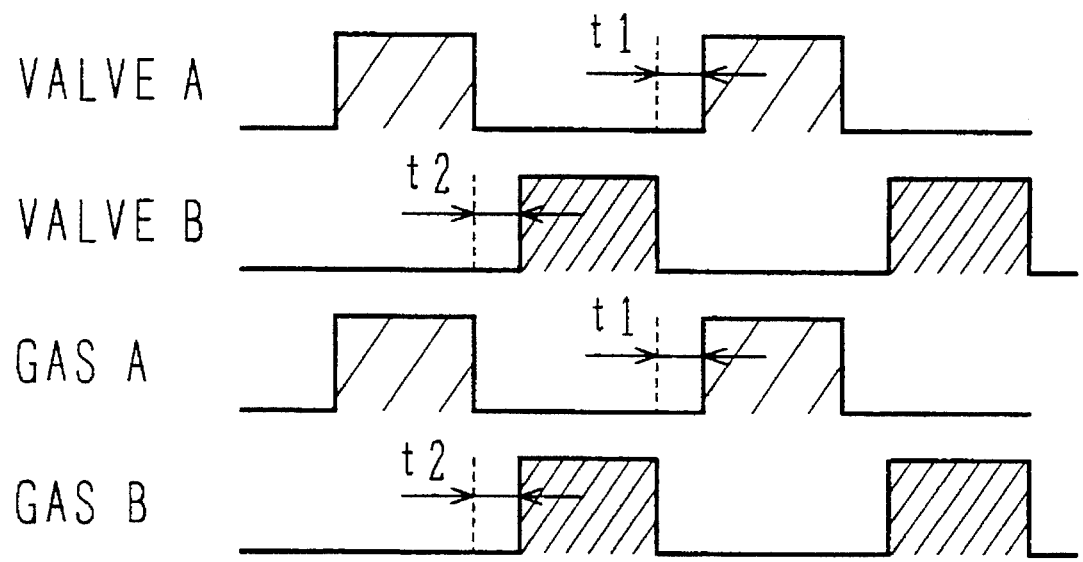

The valves for controlling the gas supply may be alternately opened and closed. FIG. 5A illustrates the case wherein a gas A and a gas B are alternately supplied by alternately controlling a valve A and a valve B. The film thickness ratio of alternately deposited thin films can be controlled by changing the time period while the valves A and B are opened. FIG. 6B illustrates the case wherein gas stop periods t1 and t2 are provided between the opening periods of the valves A and B. This case is effective for preventing mixture of gases and for reliably performing gas switching which may be performed, for example, by the controller shown in FIG. 2.

The present invention has been described in connection with the preferred embodiments. The invention is not limited only to the above embodiments. It is apparent to those skilled in the art that various modifications, substitutions, improvements, combinations and the like can be made without departing from the scope of the appended claims.

I claim:

1. A vapor phase processing system comprising:

a process chamber capable of being evacuated;

a wafer susceptor disposed in the process chamber, the wafer susceptor having a plane on which a wafer to be processed is placed;

a plurality of gas flow paths forming a structure of a plurality of spirals, facing the wafer susceptor, and being disposed along a flat plane generally parallel to the wafer susceptor; and a plurality of gas supply holes formed in a plane of the gas flow paths facing the wafer susceptor, for and along each gas flow path.

2. A vapor phase processing apparatus according to claim 1, wherein all of the plurality of gas flow paths are formed to have the same conductance of gas flow under equivalent conditions.

3. A vapor phase processing apparatus according to claim 1, wherein the size of each of the gas supply holes is different form one gas flow path to another.

4. A vapor phase processing apparatus according to claim 1, wherein the pitch of the gas supply holes is different from one flow path to another.

5. A vapor phase processing apparatus according to claim 1, further comprising a plurality of gas pipes for supplying a process gas to respective gas flow paths, each gas pipe being connected to the inner spiral start area of one of the gas flow paths.

6. A vapor phase processing apparatus according to claim 1, wherein the plurality of gas flow paths are made of conductive material, and the vapor phase process apparatus further comprises one or more high frequency power sources for supplying a high frequency power to one or more of the plurality of gas flow paths.

7. A vapor phase processing apparatus according to claim 6, wherein the plurality of gas flow paths are electrically isolated from each other and the high frequency power source is provided for each of the plurality of gas flow paths.

8. A vapor phase processing apparatus according to claim 7, wherein one of the one or more high frequency power sources is adapted to supply a high frequency power at two or more frequencies superposed on each other and at a desired frequency component power ratio.

9. A vapor phase processing apparatus according to claim 6, wherein the plane of the plurality of gas flow paths facing the susceptor is a flat plane parallel to the plane of the susceptor.

10. A vapor phase processing apparatus according to claim 7, wherein the plane of the plurality of gas flow paths facing the susceptor is a flat plane parallel to the plane of the susceptor.

11. A method for a vapor phase process comprising:

a step of placing a wafer to be processed, in a process chamber capable of being evacuated;

a first vapor phase process step of processing the wafer by supplying a first process gas from a first gas flow path group including one or more gas flow paths, the first gas flow path group being selected from a plurality of gas flow paths disposed along a flat plane generally parallel to the wafer and forming a structure of a plurality of spirals, each gas flow path independently supplying a process gas; and a second vapor phase process step of processing the wafer by supplying out a second process gas from a second gas flow path group including one or more gas flow paths different from the first gas flow path group selected from the plurality of gas flow paths.

12. A method for a vapor phase process according to claim 11, wherein one of the first and second vapor phase process steps processes the wafer while supplying a high frequency power to the plurality of gas flow paths and generating high frequency plasma in the process chamber.

13. A method for a vapor phase process according to claim 11, wherein the first and second vapor phase process steps process the wafer while supplying a high frequency power to the plurality of gas flow paths and generating high frequency plasma in the process chamber.

14. A method for a vapor phase process according to claim 13, wherein one of the first and second vapor phase process steps supplies a superposed high frequency power at two or more frequencies to one of the first and second gas flow path groups.

15. A method for a vapor phase process according to claim 11, wherein the first and second vapor phase process steps supply a high frequency power only to the first and second gas flow path groups.

16. A method for a vapor phase process according to claim 14, wherein the one of the first and second vapor phase process steps is a step of forming an SiN film by supplying a mixed gas of $SiH_4$ and $NH_3$, and the other of the first and second vapor phase process steps is a process of forming an $SiO_2$ film by supplying a mixed gas of $SiH_4$ and $N_2O$.

17. A method for a vapor phase process according to claim 11, wherein the first and second vapor phase process steps are repeated by a certain number of times for certain time periods.

18. A method for a vapor phase process according to claim 13, wherein the first and second vapor phase process steps are performed at the same time.

19. A method for a vapor phase process according to claim 18, wherein the first vapor phase process step is a step of forming an $O_3$-TEOS oxide film by supplying a mixed gas of $O_3$ and tetraethoxysilane, and the second vapor phase process step is a step of cleaning an exposed surface of the wafer by supplying a gas containing fluorine.

20. A method for a vapor phase process according to claim 11, wherein gas flow paths are formed to have different conductance of gas flow, the first and second vapor phase process steps are performed under such a condition that gas pressures at the most upstream positions of the plurality of gas flow paths are generally equal to each other, and the first and second gas flow path groups include gas flow paths selected so as to set a flow rate ratio of the first process gas to the second process gas to a certain value.

* * * * *